United States Patent [19]

Morimoto et al.

[11] 4,213,844
[45] Jul. 22, 1980

[54] ION PLATING APPARATUS

[75] Inventors: Kiyoshi Morimoto; Hiroshi Watanabe, both of Mobara; Toshinori Takagi, Nagaokakyo, all of Japan

[73] Assignee: Futaba Denshi Kogyo K.K., Chiba, Japan

[21] Appl. No.: 968,817

[22] Filed: Dec. 12, 1978

[30] Foreign Application Priority Data

Dec. 13, 1977 [JP] Japan .................... 52-148869

[51] Int. Cl.$^2$ ............................................. C23C 15/00
[52] U.S. Cl. ........................... 204/298; 204/192 N
[58] Field of Search ........................... 204/192 N, 298

[56] References Cited
U.S. PATENT DOCUMENTS

| 3,974,059 | 8/1976 | Murayama | 204/298 |
| 4,107,350 | 8/1978 | Berg et al. | 427/38 |
| 4,112,137 | 9/1978 | Zega | 427/38 |

*Primary Examiner*—John H. Mack
*Assistant Examiner*—William Leader
*Attorney, Agent, or Firm*—Oblon, Fisher, Spivak, McClelland & Maier

[57] ABSTRACT

An ion plating apparatus having a plurality of vapor sources for supplying the vapors of evaporating materials, the particles of the vapors being ionized and accelerated by an electric field to impinge on the surface of a substrate so as to form a film of the evaporating materials thereon is disclosed. An ionization chamber common to a plurality of the vapor sources, the ionization chamber being composed of parallel filaments for emitting electrons is also disclosed. Grid-shaped electron-accelerating electrodes are provided between the filaments so that the vapors of the evaporating materials pass between them, and the electron-accelerating electrodes kept at a positive potential with respect to the filaments thereby to ionize the vapors of the evaporating materials.

5 Claims, 4 Drawing Figures

ION PLATING APPARATUS

BACKGROUND OF THE INVENTION

1. Field of the Invention

The present invention relates to an ion plating apparatus which forms a film on a substrate by ionizing the vapors of evaporating materials, accelerating the ionized particles of the vapors by an electric field and making them impinge on the substrate.

2. Description of the Prior Art

Vacuum deposition, sputtering, ion plating and the like have been heretofore known as techniques to form a film on the surface of a substrate of metal, insulating material or semiconductor material under vacuum.

Among these techniques, ion plating is a technique in which the vapors of evaporating materials to be deposited on a substrate are fed into a plasma or bombarded with electrons thereby to be ionized, and the ionized particles of the above-mentioned vapors are accelerated by an electric field, thereby to impinge on the substrate with high energy.

Accordingly, in the ion plating method, the high-energy ionized particles are deposited on the substrate while sputtering the surface of the substrate. Therefore, the surface of the substrate is at all times kept clean, and consequently the film produced thereon are strong, high in adhesion and of close texture almost free of pinholes.

In the ion plating method also, the formation of films are usually performed in a high-vacuum atmosphere having a pressure of $10^{-2}$ Torr or less. The films thus obtained are high in quality, since they are hardly influenced by materials except the evaporating materials. In addition, the deposition rate is greater than that in the case of the sputtering method. Especially, when the above-mentioned ionization is performed by electron bombardment under a high vacuum having a pressure of $10^{-4}$ Torr or less, the films produced become more close in texture and high in crystallinity. In this case, acceleration voltage may be lowered to prevent increase of the substrate temperature.

For the purpose of carrying out the ion plating method, there have been proposed various types of apparatuses according to the modes of ionization of evaporating materials. FIG. 1 shows the schematical construction of an example of these apparatuses.

In FIG. 1, reference numeral 1 designates a boat which contains evaporating materials 2 to be deposited on the substrate surface. The evaporating materials 2 placed in the boat 1 are heated and vaporized by a suitable heating means, for instance, resistance heating or electron beam heating.

The evaporating materials 2 thus vaporized are fed into an ionization chamber 3 where they are ionized. The ionization chamber 3 is composed of a filament 4 and shield boards 5 for isolating the filament 4 from other regions. The filament 4 is in the form of, for instance, a coil, being energized by a power supply 12 so that it is heated to emit thermions. The thermions thus emitted from the filament 4 are accelerated toward the boat 1 by a power supply 11 provided between the filament 4 and the boat 1. While moving toward the boat 1, the thermions impinge on the vapor particles of the evaporating materials 2 and thereby ionize them.

Reference numeral 6 designates a shutter for preventing as necessary the ionized particles of the evaporating materials 2 from impinging on the substrate surface.

Reference numeral 7 designates a substrate holder for holding a substrate 8. The substrate holder 7 is kept at a high negative potential with respect to the ionization chamber 3 by a power supply 13 and thereby serves also as an electrode for giving kinetic energy to the above-mentioned ionized particles so as to move them in the direction of the substrate 8. The ionized particles of the evaporating materials 2 impinge on the surface of the substrate 8 at high speed and with high energy to form a film 9 thereon.

Reference numeral 10 designates a heater for heating the substrate 8. If, for instance, the substrate 8 is assumed to be monocrystalline and the evaporating materials 2 are to be epitaxially grown on this monocrystalline substrate 8, the heater 10 is used to heat the substrate 8 to a temperature required for epitaxial growth, or epitaxial temperature.

Except the power supplies 11 to 14, all the parts and regions shown in FIG. 1 are usually kept at a high vacuum having a pressure of $10^{-2}$ or less by provision of, for instance, a vacuum vessel not shown.

As mentioned above, the film 9 formed by ion plating is very high in adhesion to the substrate 8, close in texture and high in quality. Recently, ion plating has attracted increasing attention from various fields not only as a technique for forming coatings on the surfaces of metallic or insulating materials but also as a technique for forming the thin-film elements of semiconductors, dielectrics and magnetic materials. In addition, various efforts are being made to improve the ion plating method and also the apparatus therefore.

For instance, the following methods have been proposed in order to efficiently ionize the evaporating materials:

One is the method in which a current-collecting anode is provided at the center of the coil-shaped filament so as to accelerate and collect thermions emitted from the filament.

The other is the method in which a cylindrical mesh-shaped electron-accelerating grid is provided inside the coil-shaped filament concentrically therewith so that the thermions emitted from the filament are accelerated between the filament and the grid and enter the inside of the grid through the mesh thereof to ionize the evaporating materials.

Generally, in the ion plating method, each atom or molecule is ionized, being accelerated by an electric field to impinge on the substrate surface thereby forming a film thereon. Recently, however, a new version of ion plating called the cluster ion beam deposition method has been proposed and put into practical use. In the cluster ion beam deposition method, evaporating materials are heated and vaporized in a closed type crucible having at least one nozzle. The vapors of the evaporating materials are jetted from the nozzle into a high vacuum region where a number of atom groups each consisting of about 100 to 2,000 atoms and loosely bonded together by van der Waals forces are formed under the influence of a supercooling phenomenon caused by the adiabatic expansion of the vapors at the time when they are jetted. The above-mentioned atom groups, or clusters, are formed into cluster ions by ionizing at least one of the atoms thereof, and the cluster ions are accelerated by an electric field to impinge on the surface of the substrate thereby forming a film thereon.

In addition to the features of the usual ion plating method, the cluster ion beam deposition method has the following excellent features:

When the above-mentioned cluster ions impinge on the substrate, they are disintegrated into atomic particles. These atomic particles roll on the substrate surface thereby contributing to film formation. This phenomenon is usually called the surface migration effect. Because of this surface migration effect, the cluster ion beam deposition method can produce a film high in crystallinity and also high in adhesion to the substrate and between its atoms. In addition, the cluster ion beam deposition method can effectively form a film on a substrate of insulating material because the charge-mass ratio e/m is small.

As mentioned above, various studies and improvements have been made on the apparatus and method associated with the ion plating technique, and thereby various thin-film elements have become able to be produced. In this connection, a method of producing thin films of compounds will be hereinafter described by way of example.

FIG. 2 schematically shows the arrangement of the vapor sources and ionization chamber of the apparatus for producing two-element compounds by the above-mentioned cluster ion beam deposition method.

In FIG. 2, reference numerals 21 and 22 designate closed type crucibles having nozzles 21a and 22a, respectively. Evaporating materials 23 and 24 corresponding to the component elements of a compound to be produced are placed in the crucibles 21 and 22, respectively. These evaporating materials 23 and 24 are heated by heaters (not shown) and thereby their vapors are produced. The crucibles 21 and 22 are held in a high-vacuum atmosphere having a pressure of at least 1/100 or less of the pressure of the vapors in the crucible 21 or 22. The evaporating materials 23 and 24 vaporized are jetted from the nozzles 21a and 22a, respectively, and are converted into clusters $C_1$ and $C_2$ under the influence of supercooling caused by the adiabatic expansion of the vapors, respectively.

Ionization chambers 29 and 30 are provided in the vicinity of the nozzles 21a and 22a, respectively. These ionization chambers 29 and 30 are composed of filaments 25 and 26 adapted to emit thermions when energized and heated and shield boards 27 and 28, respectively. Power supplies for ionization are provided between the ionization chamber 29 and the crucible 21 and between the ionization chamber 30 and the crucible 22. Thus, electrons emitted from the filaments 25 and 26 are accelerated. At least one of the atoms of each of the clusters $C_1$ and $C_2$ of the evaporating materials 23 and 24 entering the ionization chambers 29 and 30 are ionized by the above-mentioned accelerated electrons to form cluster ions $C_3$ and $C_4$, respectively.

The cluster ions $C_3$ and $C_4$ are accelerated by electric fields for acceleration, impinging on the substrate surface with high energy thereby to form the film of a compound.

In producing compounds by the ion plating method such as the above-mentioned cluster ion beam deposition method, the component elements of the compound are different in ionization voltage from one another and therefore it has been a usual practice to provide ionization chambers, one for each component element of the compound.

Accordingly, in producing a multi-element compound, it becomes necessary to provide ionization chambers the number of which corresponds to that of the component elements of the compound. If, for instance, an impurity, or dopant is to be added to the compound, it becomes necessary to provide another ionization chamber for this impurity. As a result, the apparatus for this method inevitably becomes large and complicated.

In producing semiconductors or magnetic materials by the ion plating method, it is well known that the ionization rate of the evaporating materials has great influence on the crystallinity and thickness of the film.

For instance, if the ionization chamber is cylindrical as shown in FIG. 1 or FIG. 2, the density of ionization electron current at the center of the ionization chamber differs from that at the periphery thereof, and therefore the ionization rate of the evaporating materials at the center of the ionization chamber differs from that at the periphery thereof.

Accordingly, the sputtering effect produced by the ionized evaporating materials on the substrate surface becomes nonuniform resulting in uneven film thickness, uneven adhesion, uneven crystallinity, etc. Therefore, it is difficult to produce a uniform film high in crystallinity by the use of the conventional ion plating method.

SUMMARY OF THE INVENTION

Therefore, the present invention is intended to eliminate the above-mentioned disadvantages of the prior art.

It is an object of the present invention to provide an ion plating apparatus simple in construction.

It is another object of the present invention to provide an ion plating apparatus which can form high-quality films excellent in crystallinity, uniform in thickness and adhesion.

It is still another object of the present invention to provide an ion plating apparatus which can uniformize the density of ionization electron current in the ionization chamber.

It is a further object of the present invention to provide an ion plating apparatus which can uniformize the distribution of the ionization rate of the evaporating materials in the ionization chamber.

The present invention has been accomplished on the basis of the experimental findings of the inventors.

In carrying out the ion plating method using a plurality of vapor sources, provision of an ionization chamber common to a plurality of vapor sources makes it possible to efficiently perform ionization of each evaporating material, if the ionization voltage is set at a level high enough to ionize the evaporating material highest in ionization voltage. In addition, ionization of the evaporating materials can be made very uniformly and effectively, if the ionization chamber in which the vapors of the evaporating materials are introduced is composed of parallel filaments for emitting electrons and electron-accelerating grid-shaped electrodes provided in parallel inside the filaments.

The ion plating apparatus of the present invention may be advantageously used when a plurality of vapor sources, one for each element, are employed to produce multi-element compounds or to improve deposition rate.

DETAILED DESCRIPTION OF THE PREFERRED EMBODIMENT

Now, the ion plating apparatus according to a preferred embodiment of the present invention will be hereinafter described with reference to the accompanying drawings. This preferred embodiment is concerned with an apparatus for producing two-element compounds by the cluster ion beam deposition method.

Figure 1:
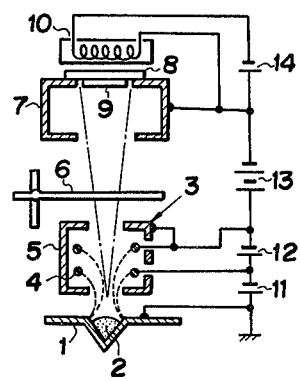
FIG. 1 schematically shows the arrangement of the conventional ion plating apparatus.
Figure 2:
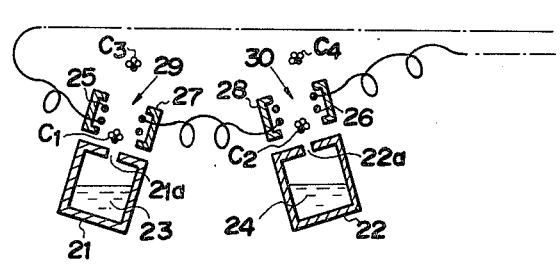
FIG. 2 schematically shows the arrangement of the essential part of the apparatus for producing compounds using the cluster ion beam deposition method.
Figure 3:
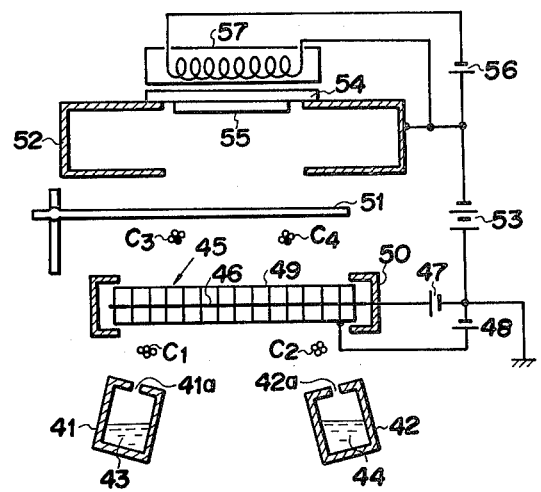
FIG. 3 schematically shows the arrangement of the ion plating apparatus according to a preferred embodiment of the present invention.

In FIG. 3, reference numerals 41 and 42 designate closed type crucibles having nozzles 41a and 42a, respectively.

Evaporating materials 43 and 44 corresponding to the component elements of a compound to be produced are placed in the crucibles 41 and 42, respectively. These crucibles or evaporating materials are heated by a suitable heating means such as resistance heating or electron beam heating. Thus, the evaporating materials 43 and 44 are vaporized.

The main parts of this apparatus including the crucibles 41 and 42 are placed in a vacuum vessel (not shown) kept at a high vacuum having a pressure of 1/100 or less of that of the vapor in the crucible 41 or 42.

The vapors of the evaporating materials 43 and 44 are jetted from the nozzles 41a and 42a into a high vacuum region. At this time, the above-mentioned vapors are formed into clusters $C_1$ and $C_2$, respectively, under the influence of supercooling caused by the adiabatic expansion of the vapors. The clusters $C_1$ and $C_2$ are accelerated by the energy given when jetted, entering an ionization chamber 45. The ionization chamber 45 is composed of parallel filaments 46, electron-accelerating electrodes 49 (hereinafter referred to as an anode cage) and shield boards 50. The filaments 46 are provided in parallel with each other and adapted to emit thermions when energized and heated by a power supply 47. The anode cage 49 (or electron-accelerating electrodes) is provided inside the filaments 46, being grid-shaped, ladder-shaped or stripe-shaped. In addition, the anode cage 49 is kept at a positive potential with respect to the filaments 46 by means of a power supply 48 for ionization. The filaments 46 shown in FIG. 3 are rectlinear, but they may be in the form of coils, as a matter of course.

Figure 4:
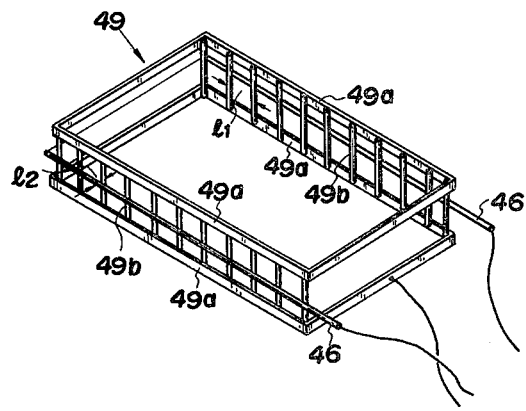
FIG. 4 shows the construction of the essential part of the apparatus shown in FIG. 3.

The construction of the ionization chamber 45 may be determined according to the size and number of the vapor sources. An example of the ionization chamber 45 is shown in FIG. 4.

A pair of conductive frame members 49a and 49a, one above the other, are disposed between the two filaments 46 and 46. Conductive parallel wires 49b are vertically provided in the form of grids on the two sides of the frame members 49a facing the filaments 46. The anode cage 49 is thus formed. The filaments 46 and the anode cage 49 are isolated from other regions by means of the shield boards 50 to form the ionization chamber 45.

In this case, in order to make the anode cage 49 effectively collect electrons emitted from the filaments 46, it is desirable to make the distance $l_2$ between the filament 46 and the wire 49b equal to or less than the interval $l_1$ between the wires 49b constituting the anode cage 49.

A power supply 47 for heating is connected to the filaments 46. When energized and heated by the power supply 47, the filaments 46 emit electrons. An ionization power supply 48 having a voltage high enough to ionize the vapors of the evaporating materials 43 and 44 is provided between the filament 46 and the anode cage 49. Electrons emitted from the filaments 46 are accelerated by an electric field formed between the filament 46 and the anode cage 49 by the ionization power supply 48, entering the inside of the anode cage 49 through the spaces between the wires 49b of the anode cage 49.

In this case, the wires 49b of the anode cage 49 are arranged along and in parallel with the filaments 46, being kept at the same potential because the frame members 49a are made of conductive material. Accordingly, the electric field along the filament is kept uniform and therefore the electrons accelerated by the anode cage 49 have a uniform density along the filament 46.

As a result, the clusters $C_1$ and $C_2$ entering the ionization chamber 45 are uniformly ionized by electron currents having a uniform density along the filament 46. Thus, cluster ions $C_3$ and $C_4$ are formed.

Reference numeral 51 designates a shutter for preventing as necessary the substrate from being bombarded with ionized particles. Reference numeral 52 designates a substrate holder which also serves as an electrode for accelerating the cluster ions $C_3$ and $C_4$. Reference numeral 53 designates an accelerating power supply provided between the substrate holder 52 and the ionization chamber 45 and connected thereto. When the shutter 51 is opened, the cluster ions $C_3$ and $C_4$ are accelerated by an electric field formed by the action of the accelerating power supply 53. Thus, the cluster ions $C_3$ and $C_4$ are given kinetic energy, impinging on the surface of a substrate 54 with high energy to form a film 55 of a compound thereon. Owing to the characteristic effects that the ion plating technique or the cluster ion beam deposition method has, the film 55 thus obtained is homogeneous and uniform in adhesion, thickness, crystallinity, etc.

In other words, the electron current in the anode cage 49 of the ionization chamber 45 becomes uniform in density, and therefore the clusters $C_1$ and $C_2$ fed into the anode cage 49 are ionized uniformly and effectively.

Consequently, the sputtering effect, heating effect, ion implantation effect, surface migration effect are uniformly produced throughout the entire surface of the substrate 54 on which the cluster ions $C_3$ and $C_4$ impinge, and therefore the film 55 of the compound obtained is uniform in thickness and adhesion.

A heater 57 is provided in the vicinity of the substrate 54, being energized by a heating power supply 56 to heat the substrate 54. Thus, when a thin film of a compound is to be epitaxially grown on the substrate 54, the clusters $C_1$ and $C_2$ are uniformly ionized and impinge on the surface of the substrate 54, and therefore an epitaxial layer uniform in crystallinity throughout the entire surface of the substrate 54 can be obtained.

In this preferred embodiment, as mentioned above, only one ionization chamber 45 is required for a plurality of crucibles 41 and 42. Therefore, the apparatus can be made very simple in construction, being easy to produce. In addition, its maintenance and inspection can be very easily performed.

In the above-mentioned preferred embodiment, description is made, by way of example, on the apparatus for carrying out the cluster ion beam deposition method. However, the present invention can be applied, as a matter of course, to the usual ion plating method using a boat or one-end open type crucibles as vapor sources, or to the ion plating method in which one of the evaporating materials is gaseous as in the case of the production of the films of oxides and nitrides.

As mentioned above, the present invention can apply to the production of compounds. In addition, the present invention may be similarly applied when the same evaporating material is vaporized from a plurality of vapor sources and ionized for the purpose of increasing the deposition rate or forming a film on the substrate having a wide surface area.

The construction of the ionization chamber is not limited to that shown in FIG. 4. For instance, the grid wires of the anode cage may be provided in parallel with the parallel filaments.

As mentioned above, the ion plating apparatus of the present invention comprises a plurality of vapor sources, an ionization chamber common to the vapor sources, the ionization chamber being composed of parallel filaments adapted to emit electrons when energized and heated and a grid-shaped anode cage of conductive material provided between the filaments so that the vapors of evaporating materials generated from the vapor sources pass through it, and the anode cage being kept at a positive potential with respect to the filaments to give ionization voltage.

Accordingly, the electron current accelerated toward the anode cage becomes uniform in density along the direction of the filament. As a result, the vapors of the evaporating materials, generated from a plurality of the vapor sources and fed into the anode cage, are ionized uniformly and effectively. Consequently, ionized particles impinging on the substrate are uniformly distributed throughout the entire surface of the substrate. Even in the case of the production of compounds, a compound film homogeneous throughout the entire surface can be obtained. Thus, according to the present invention, high-quality films uniform in thickness and adhesion can be produced.

When a crystalline thin film is produced using the ion plating apparatus according to the present invention, the ionization of the evaporating materials are uniformly performed and the efficiency of ionization is improved as mentioned above, and therefore a uniform thin film high in crystallinity is obtained throughout the entire surface of the substrate. Especially, in producing electronic materials whose crystallinity has great influence on the performance of elements, the present invention produces a great effect.

According to the ion plating apparatus of the present invention, a single ionization chamber is enough for a plurality of vapor sources. Therefore, the apparatus is simple in construction, easy to produce, simple and easy to operate, easy to maintain and inspect.

Obviously many modifications and variations of the present invention are possible in the light of the above teachings. It is therefore to be understood that within the scope of the appended claim the invention may be practiced otherwise than as specifically described.

What is claimed as new and desired to be secured by Letters Patent of the United States is:

1. In an ion plating apparatus having a plurality of vapor sources for supplying the vapors of evaporating materials, and the particles of said vapors being ionized and accelerated by an electric field to impinge on the surface of a substrate so as to form a film of said evaporating materials thereon, the improvement which comprises an ionization chamber provided so that it is common to a plurality of said vapor sources and positioned between said sources and said substrate, said ionization chamber comprising a plurality of parallel filaments extending along opposite sides of said chamber adapted to emit electrons when energized and heated and a plurality of electron-accelerating electrodes, all said electrodes provided between said filaments so that the vapors of the evaporating materials generated from said vapor sources pass between said electron accelerating electrodes, and said electron-accelerating electrodes adapted to be kept at a positive potenital with respect to said filaments thereby to ionize the vapors of the evaporating materials supplied from said plurality of said vapor sources.

2. An ion plating apparatus as claimed in claim 1 wherein said electron-accelerating electrodes are in the shape of a grid having members substantially in parallel with each other.

3. An ion plating apparatus as claimed in claim 1 wherein said electron-accelerating electrodes are made of a pair of frame members having conductive parallel wires spaced from one another by predetermined intervals and arranged perpendicular to said frame members in the form of a grid between said frame members.

4. An ion plating apparatus as claimed in claim 3 wherein distance between said filaments and wires is equal to the minimum interval between said wires.

5. An ion plating apparatus as claimed in claim 3 wherein distance between said filaments and wires is less than the minimum interval between said wires.

* * * * *